United States Patent
Murai et al.

(10) Patent No.: US 10,269,885 B2
(45) Date of Patent: Apr. 23, 2019

(54) DISPLAY DEVICE HAVING MULTIPLE PROTECTIVE FILMS

(71) Applicant: JOLED Inc., Tokyo (JP)

(72) Inventors: Atsuhito Murai, Tokyo (JP); Eiichi Sato, Tokyo (JP); Masanori Miura, Tokyo (JP)

(73) Assignee: JOLED INC., Tokyo (JP)

( * ) Notice: Subject to any disclaimer, the term of this patent is extended or adjusted under 35 U.S.C. 154(b) by 20 days.

(21) Appl. No.: 15/459,257

(22) Filed: Mar. 15, 2017

(65) Prior Publication Data

US 2017/0271423 A1 Sep. 21, 2017

(30) Foreign Application Priority Data

Mar. 16, 2016 (JP) .................................. 2016-052744

(51) Int. Cl.
*H01L 27/32* (2006.01)
*H01L 51/52* (2006.01)

(52) U.S. Cl.
CPC ...... *H01L 27/3262* (2013.01); *H01L 27/3276* (2013.01); *H01L 51/5253* (2013.01); *H01L 27/3297* (2013.01); *H01L 2227/323* (2013.01)

(58) Field of Classification Search
CPC .......................... H01L 27/3262; H01L 27/3276
USPC ......................................................... 257/72
See application file for complete search history.

(56) References Cited

U.S. PATENT DOCUMENTS

| 2003/0094615 A1* | 5/2003 | Yamazaki ............... H01L 27/12 257/72 |
| 2006/0033429 A1 | 2/2006 | Fujimura et al. |
| 2008/0252839 A1 | 10/2008 | Nakadaira |
| 2012/0062107 A1 | 3/2012 | Fujimura et al. |
| 2013/0249385 A1 | 9/2013 | Fujimura et al. |

FOREIGN PATENT DOCUMENTS

| JP | 2006-54111 A | 2/2006 |
| JP | 2012-134173 A | 7/2012 |

* cited by examiner

*Primary Examiner* — Caleb E Henry
(74) *Attorney, Agent, or Firm* — Hauptman Ham, LLP

(57) ABSTRACT

According to one embodiment, a display device includes a pixel area including pixels each including at least one thin film transistor includes a semiconductor layer and a gate electrode, a first terminal area including a first wiring line disposed thereon connected to the at least one thin film transistor, a first protective film provided on the semiconductor layer, the gate electrode and the first wiring line, a first insulating film provided on the first protective film, a second protective film provided on the first insulating film, a second insulating film provided on the second protective film, a first opening formed in the first terminal area, and partially exposing the first wiring line, and a second opening formed to correspond to the first opening.

13 Claims, 14 Drawing Sheets

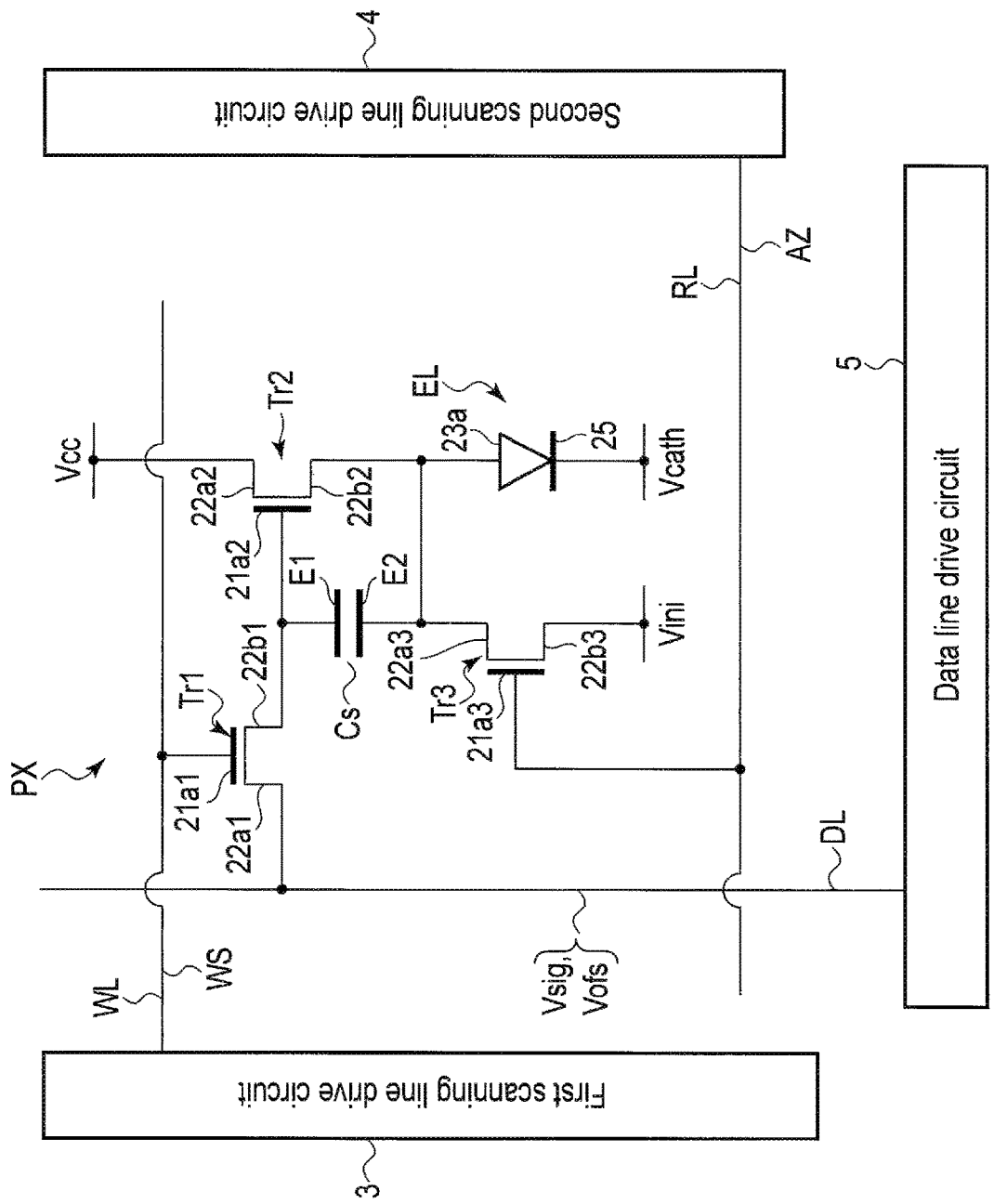
F I G. 2

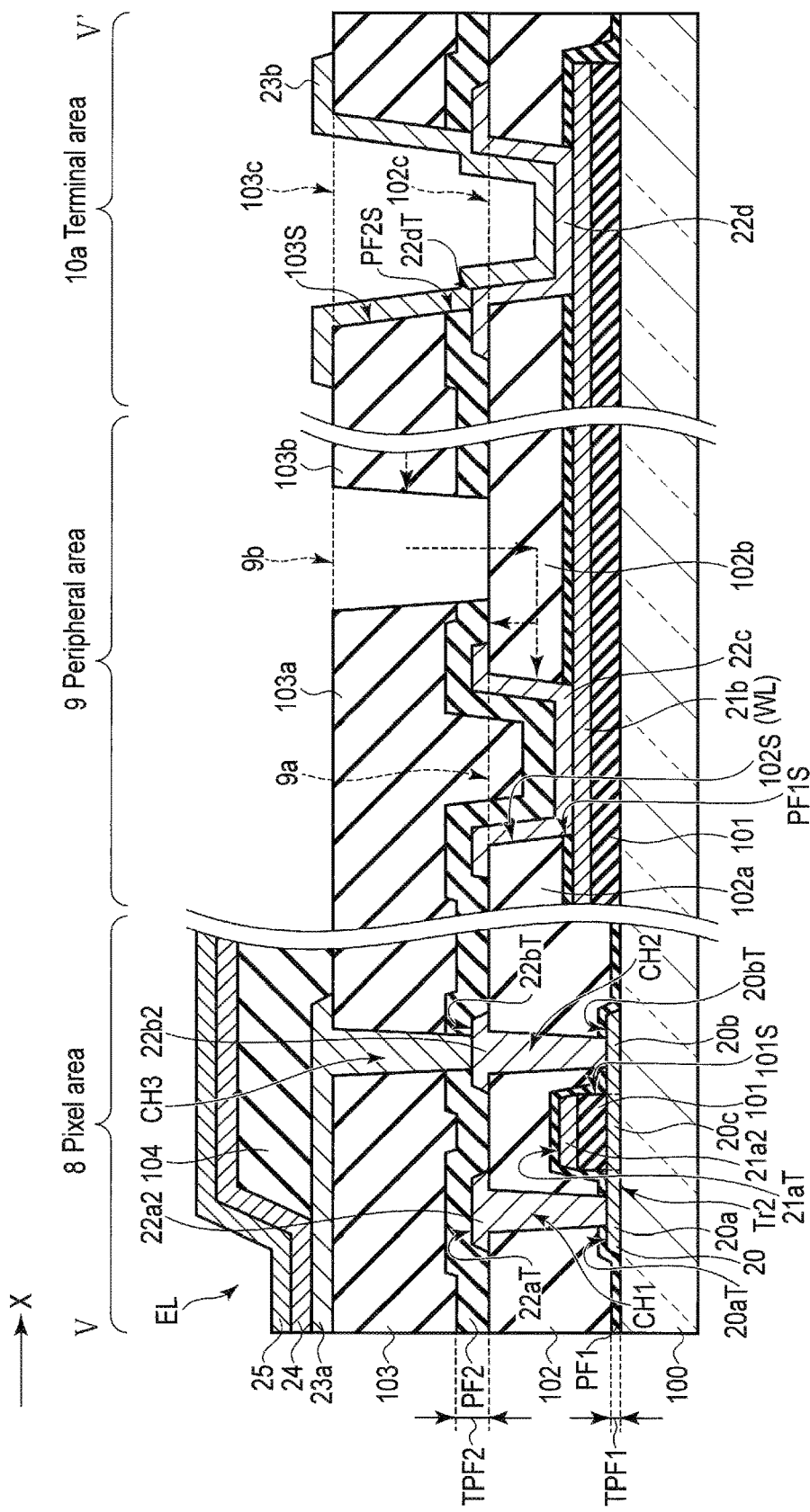
F I G. 5A

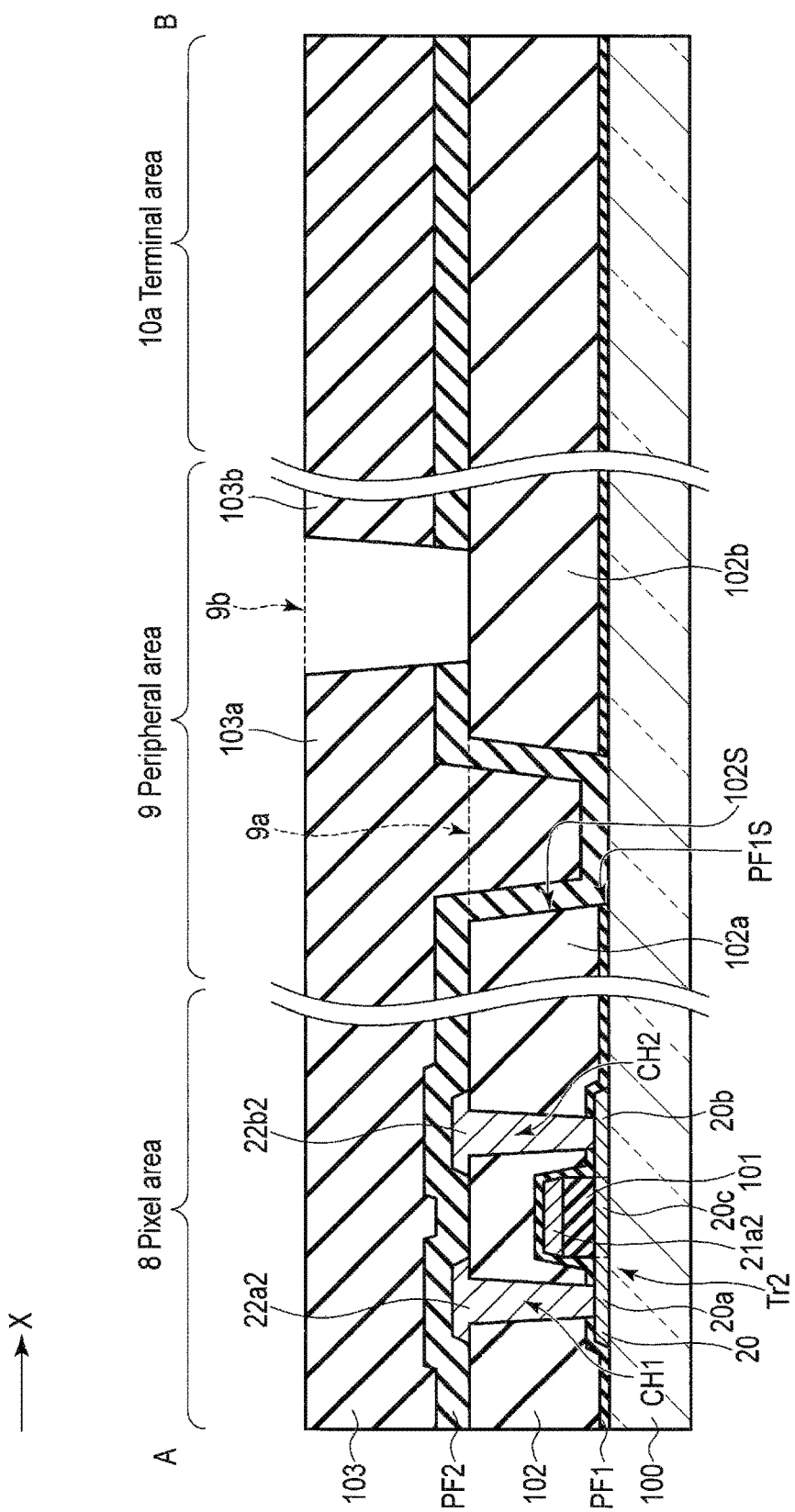
F I G. 5B

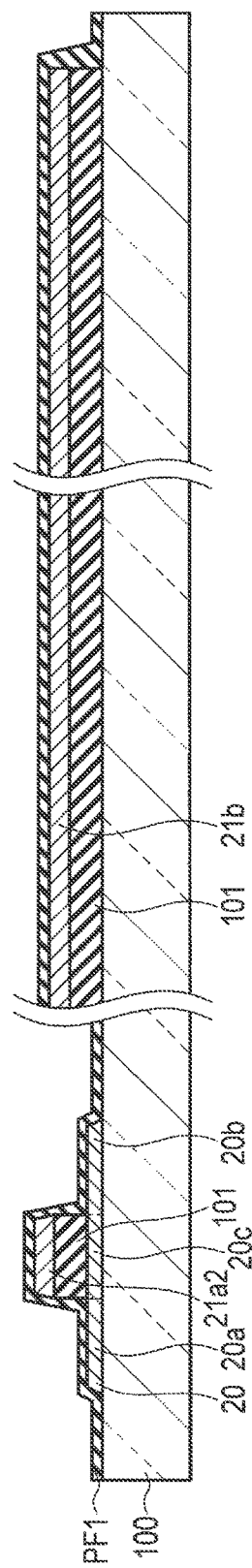
F I G. 7A

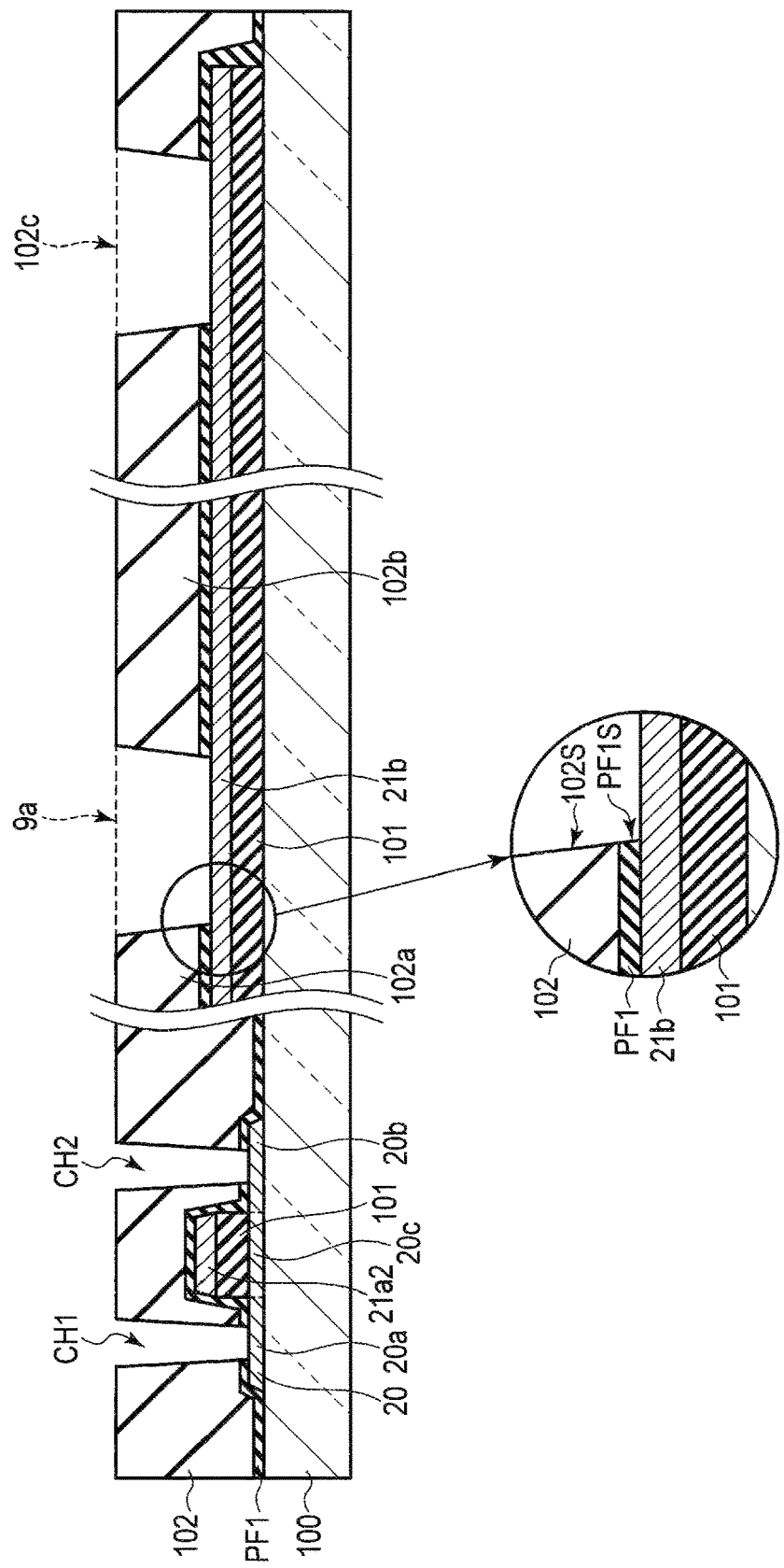
F I G. 7B

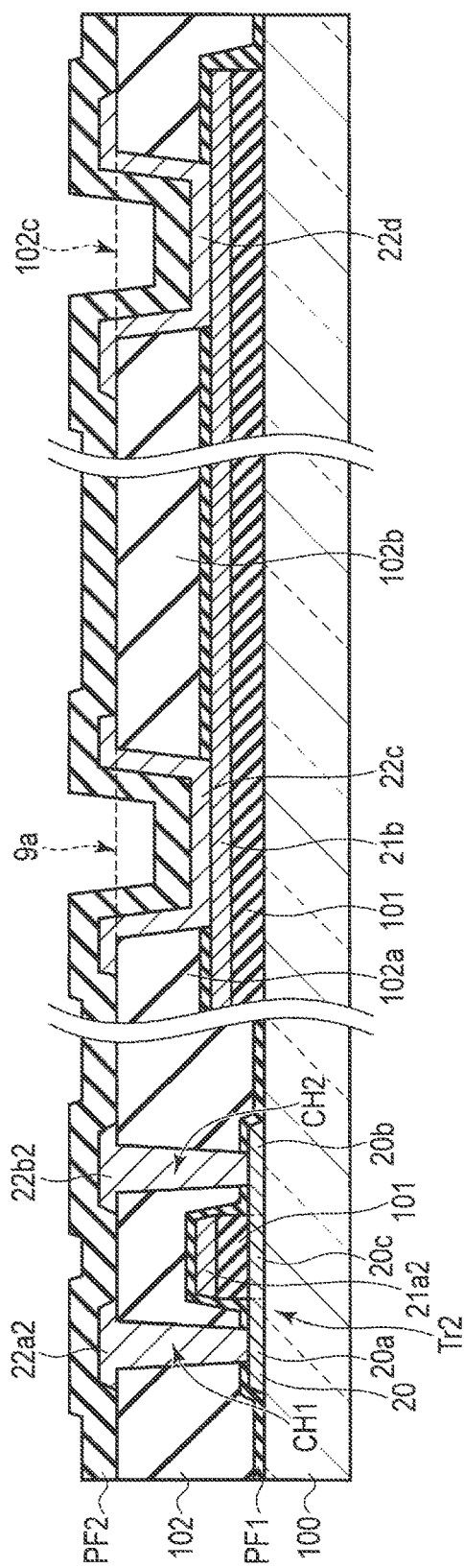
F I G. 8A

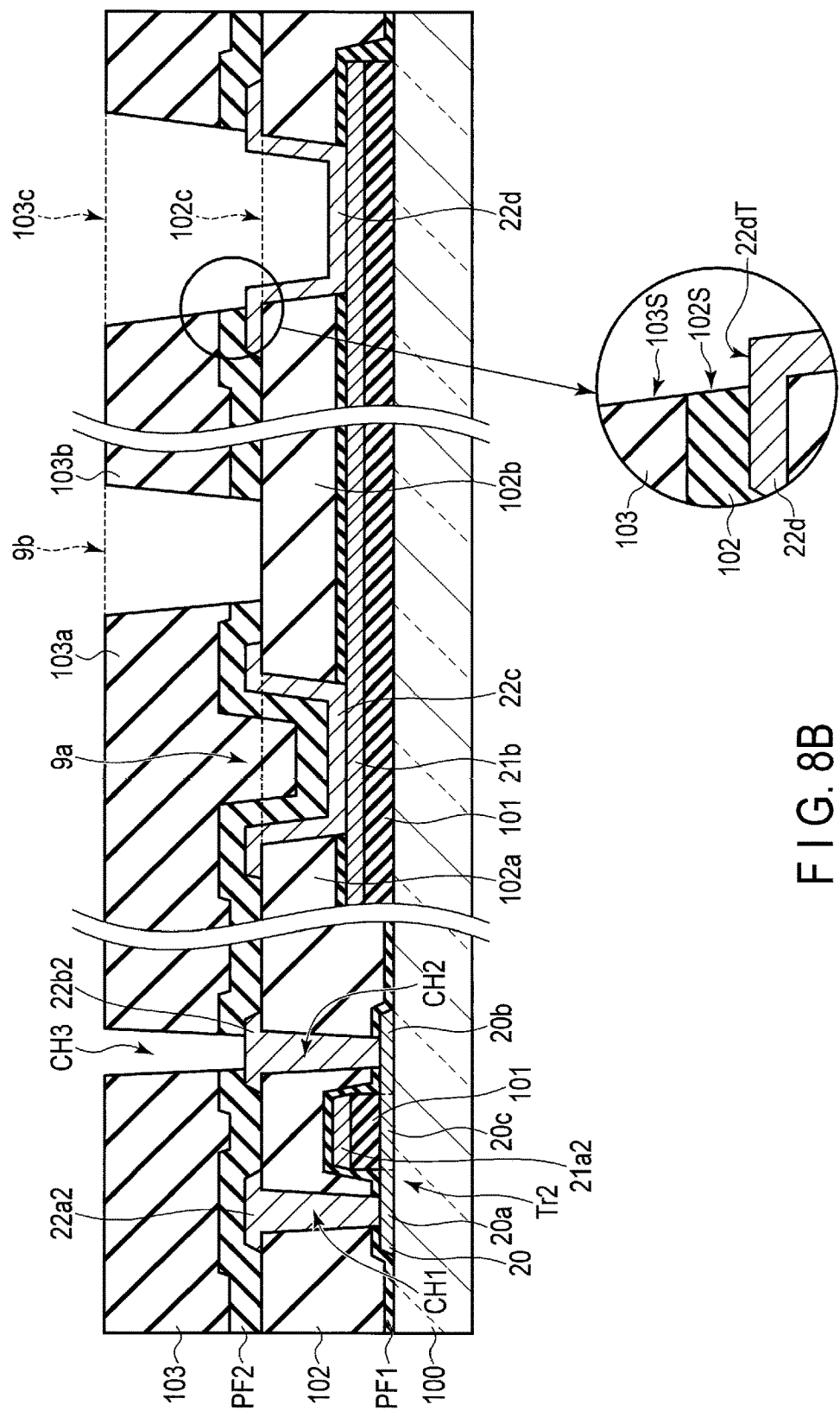
F I G. 8B

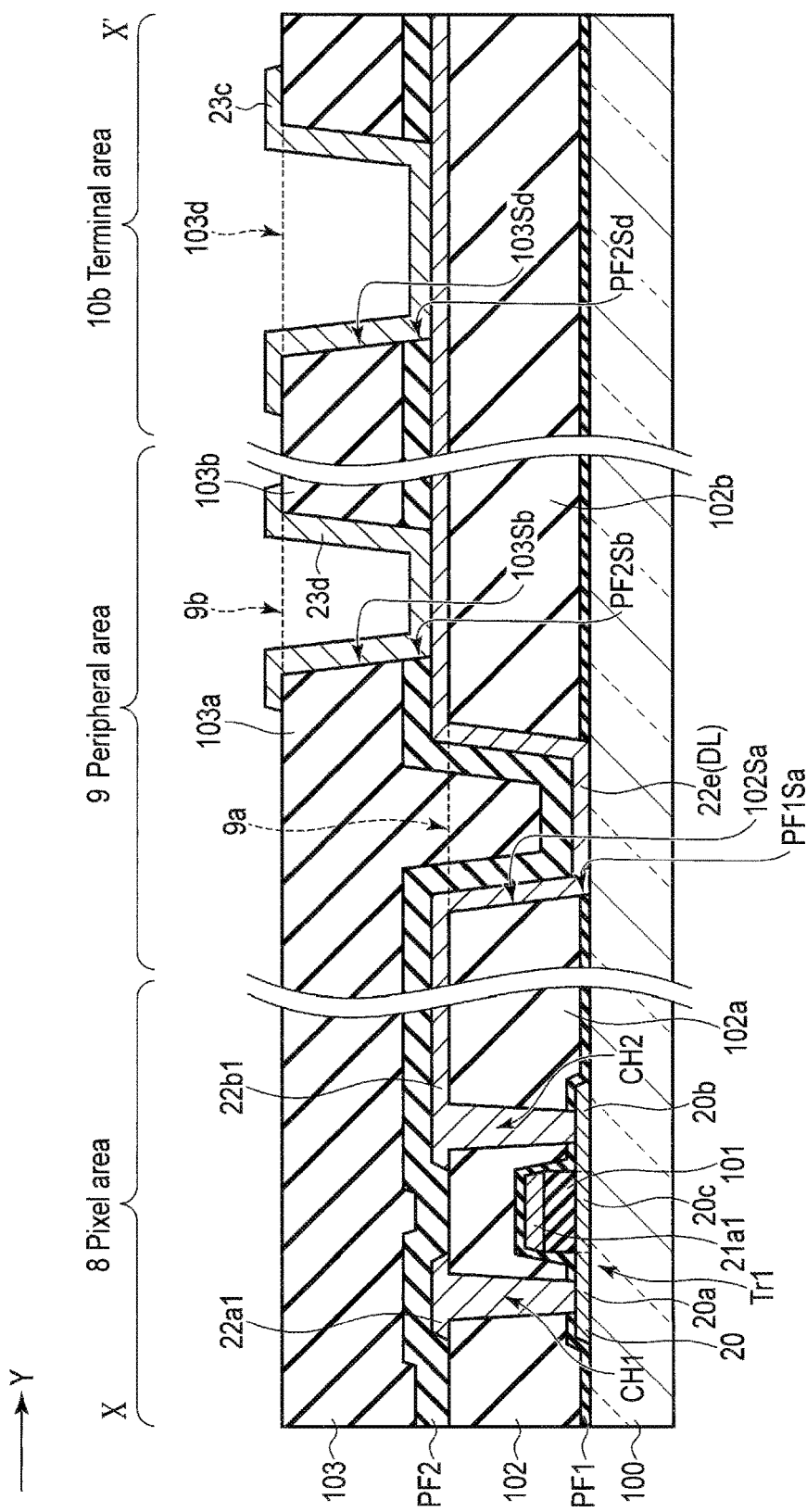
F I G. 10

DISPLAY DEVICE HAVING MULTIPLE PROTECTIVE FILMS

CROSS-REFERENCE TO RELATED APPLICATIONS

This application is based upon and claims the benefit of priority from Japanese Patent Application No. 2016-052744, filed Mar. 16, 2016, the entire contents of which are incorporated herein by reference.

FIELD

Embodiments described herein relate generally to a display device comprising an organic electroluminescence (EL) element.

BACKGROUND

As the displays of, for example, televisions, personal computers, smartphones, tablet computers, etc., display devices which employ an organic EL device have been developed. The organic EL device emits light when voltage is applied to an organic material disposed between a positive electrode and a negative electrode.

Organic EL devices are driven, for example, by thin-film transistors. The organic EL devices and the thin-film transistors including, for example, an oxide semiconductor layer deteriorate by contact with moisture, hydrogen, or the like.

BRIEF DESCRIPTION OF THE DRAWINGS

FIG. 2 is a circuit diagram schematically showing an example of the pixel shown in FIG. 1.

FIG. 5A is a cross section taken along the line V-V' shown in FIG. 3.

FIG. 5B is a cross section taken along the line A-B shown in FIG. 3.

FIG. 7A is a cross section showing a manufacturing step which follows that shown in FIG. 6C.

FIG. 7B is a cross section showing a manufacturing step which follows that shown in FIG. 7A.

FIG. 8A is a cross section showing a manufacturing step which follows that shown in FIG. 7C.

FIG. 8B is a cross section showing a manufacturing step which follows that shown in FIG. 8A.

FIG. 10 is a cross section taken along the line X-X' shown in FIG. 3.

DETAILED DESCRIPTION

Figure 1:
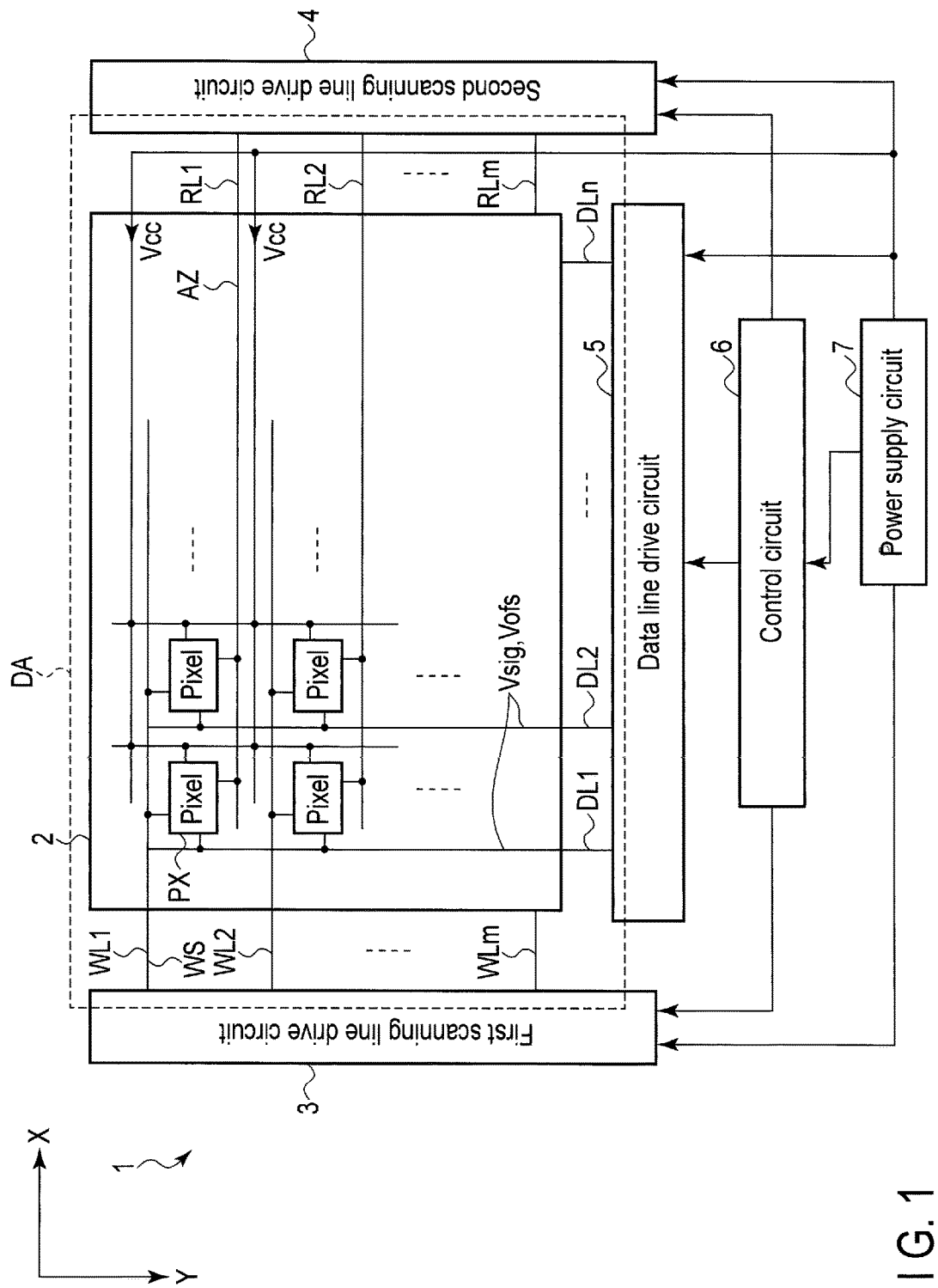
FIG. 1 is a circuit diagram schematically showing an example of the display device to according to this embodiment.

In general, according to one embodiment, there is provided a display device comprises: a pixel area provided above an insulating substrate, and including pixels each including at least one thin film transistor comprising a semiconductor layer including a drain/source region separated by channel region and a gate electrode formed on the semiconductor layer prepared via a gate insulating film; a first terminal area provided above the insulating substrate and including a first wiring line disposed thereon connected to the at least one thin film transistor; a first protective film provided on the semiconductor layer, the gate electrode and the first wiring line, as an insulating film containing a metal; a first interlayer insulating film provided on the first protective film; a second protective film provided on the first interlayer insulating film, as an insulating film containing a metal; a second interlayer insulating film provided on the second protective film; a first opening formed in the first protective film and the first interlayer insulating film in the first terminal area, and partially exposing the first wiring line; and a second opening formed in the second protective film and the second interlayer insulating film to correspond to the first opening.

According to one embodiment, there is provided a display device comprises: a pixel area provided above an insulating substrate, and including pixels each including at least one thin film transistor comprising a semiconductor layer including a drain/source region separated by channel region and a gate electrode formed on the semiconductor layer prepared via a gate insulating film; a second terminal area provided above the insulating substrate; a first protective film provided on the semiconductor layer, the gate electrode and the insulating substrate, as an insulating film containing a metal; a first interlayer insulating film provided on the first protective film; a second wiring line provided on the first interlayer insulating film and connected to the at least one thin film transistor; a second protective film provided on the second wiring line, as an insulating film containing a metal; a second interlayer insulating film provided on the second protective film; and a third opening formed in the second protective film and the second interlayer insulating film in the second terminal area, and partially exposing the second wiring line.

According to one embodiment, there is provided a display device comprises: a pixel area including a thin film transistor and provided above an insulating substrate; a peripheral area adjacent to the pixel area, provided above the insulating substrate; a first protective film located above the insulating substrate; a first interlayer insulating film located above the first protective film and in contact with the first protective film; a second protective film located above the first interlayer insulating film and in contact with the first interlayer insulating film; and a second interlayer insulating film located above the second protective film and in contact with the second protective film, the first protective film and the first interlayer insulating film comprising a first trench, the second protective film being provided in the first trench, and the second protective film and the second interlayer insulating film comprising a second trench through to the first protective film and being separated from the pixel area further than the first trench.

Embodiments will be described hereinafter with reference to the accompanying drawings. The disclosure is merely an example, and proper changes within the spirit of the invention, which are easily conceivable by a skilled person, are included in the scope of the invention as a matter of course.

In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

FIG. 1 is a circuit diagram schematically showing an example of a display device 1 to according to an embodiment. The display device 1 is an active-matrix display device. In this embodiment, an organic electroluminescence (EL) display device which employs an organic EL element will be discussed, but the display devices 1 may be of some other type, for example, a liquid crystal display including a liquid crystal layer.

The display device 1 comprises a display area DA and drivers provided in a periphery of the display area DA. The display area DA includes a pixel section 2, and the driver includes a first scanning line drive circuit 3, a second scanning line drive circuit 4, a data line drive circuit 5, a control circuit 6 and a power supply circuit 7. The first scanning line drive circuit 3 and the second scanning line drive circuit 4 are disposed, for example, respectively near both sides of the pixel section 2 along a row direction X. The data line drive circuit 5, the control circuit 6, and the power supply circuit 7 are disposed near one side of the pixel section 2 along a column direction Y. The first scanning line drive circuit 3, the second scanning line drive circuit 4, and the data line drive circuit 5 are formed at least partially on a panel (not shown) which constitutes the display device 1.

The pixel section 2 comprises a plurality of pixels PX arranged in a matrix. In the pixel section 2, a plurality of first scanning lines WL (WL1 to WLm) and second scanning lines RL (RL1 to RLm) extending along the row direction X and a plurality of data lines DL (DL1 to DLn) extending in the column direction Y crossing the row direction X are formed so as to correspond to the pixels PXs, respectively. Note that m and n each represent a positive integer.

Each of the first scanning lines WL is extended to the outside of the pixel section 2 and is electrically connected to the first scanning line drive circuit 3. Each of the second scanning lines RL is extended to the outside of the pixel section 2 and is electrically connected to the second scanning line drive circuit 4. Each of the data lines DL is extended to the outside of the pixel section 2 and is electrically connected to the data line drive circuit 5.

The first scanning line drive circuit 3 supplies write scanning signals WS sequentially to each of the first scanning lines WL. Thus, a plurality of pixels PX arranged along the row direction X are sequentially selected.

The second scanning line drive circuit 4 supplies drive scanning signals AZ to each of the second scanning lines RL in synchronism with the write scanning signals WS supplied by the first scanning line drive circuit 3. Thus, the light emission and extinction of the pixels PX are controlled.

The data line drive circuit 5 supplies selectively a signal voltage Vsig or a reference voltage Vofs to the data lines DL. The signal voltage Vsig is the voltage of a signal according to the brightness of a video signal. The reference voltage Vofs is a voltage used as a standard of the signal voltage and is equivalent to the voltage of the signal which indicates a black level, for example. The reference voltage Vofs is used also to compensate the variation in threshold voltage of the drive transistors which drive the organic EL devices, which will be described later.

The control circuit 6 produces various signals necessary to display images on the pixel section 2 based on external signals supplied from an external signal source. The control circuit 6 outputs the thus produced various signals to the first scanning line drive circuit 3, the second scanning line drive circuit 4 and the data line drive circuit 5, respectively and controls the first scanning line drive circuit 3, the second scanning line drive circuit 4 and the data line drive circuit 5 to operate in synchronism with each other.

The power supply circuit 7 supplies power to the first scanning line drive circuit 3, the second scanning line drive circuit 4, the data line drive circuit 5, the control circuit 6 and the wiring lines, and also supplies a predetermined voltage to various wiring lines.

FIG. 2 is a circuit diagram schematically showing an example of a pixel PX.

The pixel PX comprises a write transistor Tr1, a drive transistor Tr2, a reset transistor Tr3, a capacitor Cs and a light-emitting device EL.

A gate electrode $21a1$ of the write transistor Tr1 is connected to the respective first scanning line WL, and a drain electrode $22a1$ is connected to the respective data line DL, and a source electrode $22b1$ is connected to a first electrode E1 of the capacitor Cs and a gate electrode $21a2$ of the drive transistor Tr2.

A drain electrode $22a2$ of the drive transistor Tr2 is connected to a wiring line to which a power source voltage Vcc is supplied and a source electrode $22b2$ is connected to an anode $23a$ of the light emitting device EL, a second electrode E2 of the capacitor Cs and a source electrode $22a3$ of the reset transistor Tr3. A cathode 25 of the light emitting device EL is connected to a wiring line to which a cathode voltage Vcath is supplied.

A gate electrode $21a3$ of the reset transistor Tr3 is connected to the respective second scanning line RL, and a drain electrode $22b3$ is connected to a wiring line to which a fixed voltage Vini is supplied.

In the pixel PX of the above-described configuration, when a write scan signal WS is supplied to the first scanning line WL, the write transistor Tr1 is placed in a conduction state. In the conduction state, the write transistor Tr1 supplies the signal voltage Vsig or reference voltage Vofs supplied through the data line DL to the gate electrode $21a2$ of the drive transistor Tr2. The capacitor Cs holds the signal voltage Vsig or the reference voltage Vofs. If the voltage held at the capacitor Cs exceeds a threshold voltage, the drive transistor Tr2 is set in an on state to supply the current based on the voltage held at the capacitor Cs to the light-emitting device EL. The light-emitting device EL emits light at a brightness corresponding to the current supplied from the drive transistor Tr2.

When a drive scanning signal AZ is supplied to the second scanning line RL, the reset transistor Tr3 is placed in a conduction state. In the conduction state, the reset transistor Tr3 supplies the fixed voltage Vini to, for example, the source electrode $22b2$ of the drive transistor Tr2 and the anode electrode $23a$ of the light-emitting device EL, to reset (initialize) the voltages at these electrodes to the fixed voltage Vini. Here, when the threshold voltage of the light emitting device EL is defined as Vth, the relationship of the threshold voltage Vth, a cathode voltage Vcath and the fixed voltage Vini can be expressed by the following formula:

$$Vini < Vth + Vcath$$

Figure 3:
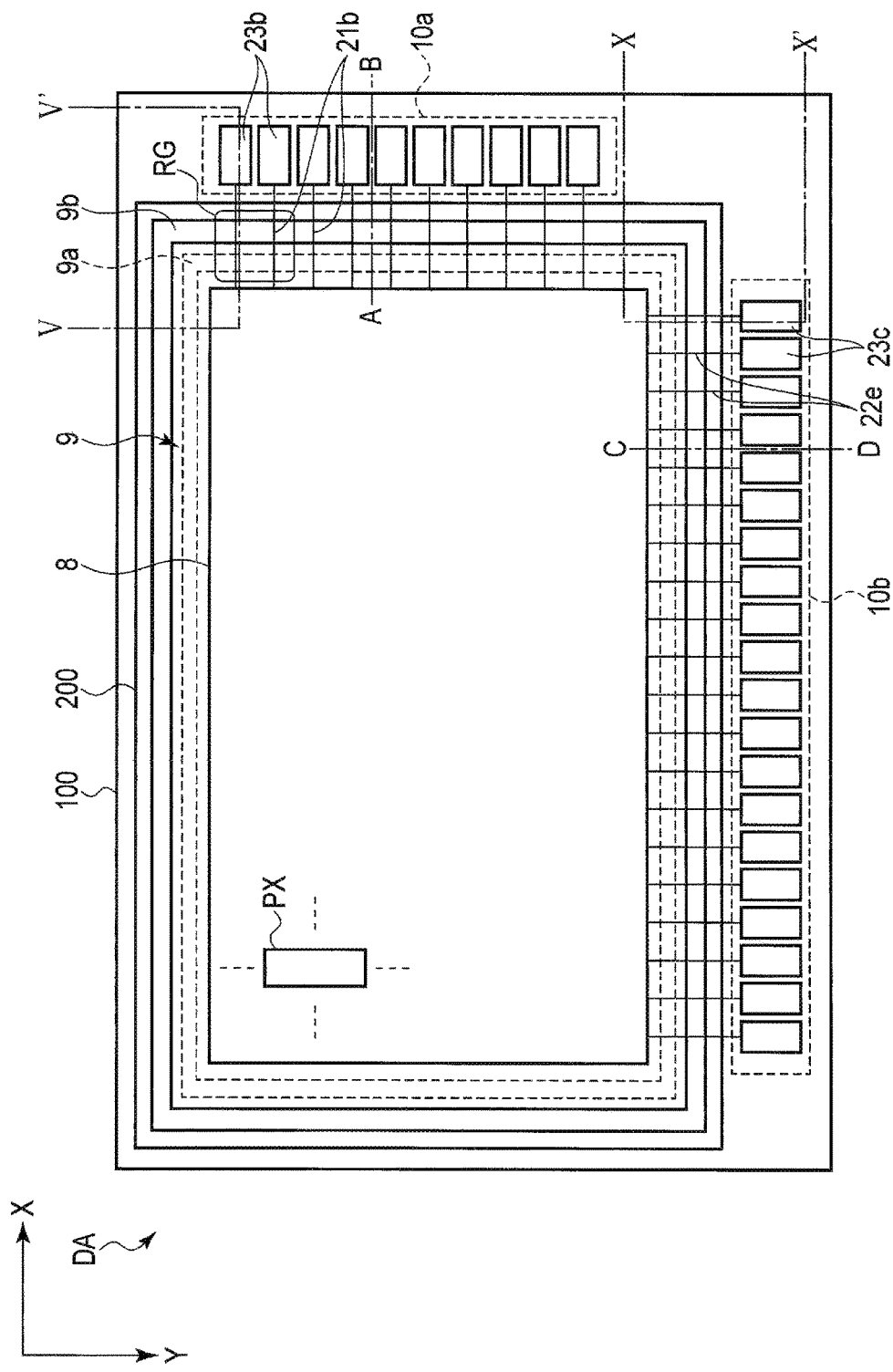
FIG. 3 is a plan view schematically showing an example of the display area shown in FIG. 1.

FIG. 3 is a plan view schematically showing an example of the pattern of the display area DA enclosed by a dashed line in the display device 1 shown in FIG. 1. FIG. 3 shows an example in which the first scanning line drive circuit 3 and the second scanning line drive circuit 4 shown in FIGS. 1 and 2 are provided on one side of the display area DA along the row direction X, whereas the data line drive circuit 5 and the like are provided on one side of the display area DA along the column direction Y. But, the arrangement of the drivers may be changed as needed.

The display area DA comprises an insulating substrate 100 and a counter-substrate 200 opposing the insulating substrate 100. The insulating substrate 100 comprises light emitting-devices such as organic EL devices which constitute the pixels PX, switching elements for driving the light-emitting devices, wiring lines connecting the respective elements to each other, and the like, as shown in FIG. 1 or FIG. 2. The counter-substrate 200 comprises a color filter, a light-shielding film, (not shown) etc. The insulating substrate 100 and the counter-substrate 200 are adhered together via an adhesive layer.

The display area DA includes a pixel area 8, a peripheral area 9 and terminal areas 10a and 10b. The pixel area 8 is provided in a region corresponding to a central portion where the insulating substrate 100 and the counter-substrate 200 are stacked. The pixel area 8 corresponds to the pixel section 2 shown in FIG. 1 and includes a plurality of pixels PX arranged, for example, in a matrix.

The peripheral area 9 is provided around the circumference of the pixel area 8 to enclose the pixel area 8. The peripheral area 9 includes two trenches 9a and 9b which prevent invasion of moisture to the pixel area 8. The trenches 9a and 9b are annular, and are respectively formed in different insulating films, as will be described later. The trench 9a surrounds the pixel area 8. The trench 9b surrounds the trench 9a. The trenches 9a and 9b may be formed in a part of the peripheral area 9. For example, the trenches 9a and 9b may be formed only in a region along sides of the pixel area 8, where wiring lines 21b and 22e are respectively arranged.

The terminal area 10a is provided on one side of the peripheral area 9 along the row direction X. The wiring lines 21b drawn out from the pixel area 8 to a row-direction X side are connected respectively to a plurality of terminals 23b formed in the terminal area 10a. In this embodiment, the wiring lines 21b are equivalent to, for example, the first scanning lines WL or the second scanning lines RL in FIGS. 1 and 2.

The terminal area 10b is provided on one side of the peripheral area 9 along the column direction Y. The wiring lines 22e drawn out from the pixel area 8 to a column-direction Y side are connected respectively to a plurality of terminals 23c formed in the terminal area 10b. In this embodiment, the wiring lines 22e are equivalent to, for example, the data lines DL in FIGS. 1 and 2.

The drivers including the first scanning line drive circuit 3, the second scanning line drive circuit 4 and the data line drive circuit 5, shown in FIGS. 1 and 2 supply various signals to the respective pixels PX through the terminals 23b and 23c. Note that the drivers may be connected through, for example, a flexible printed circuit board or the like, connected to the terminals 23b and 23c. Note that the arrangement of the terminal areas 10a and 10b is not limited to the above-described example, but may be changed as appropriate.

Figure 4:
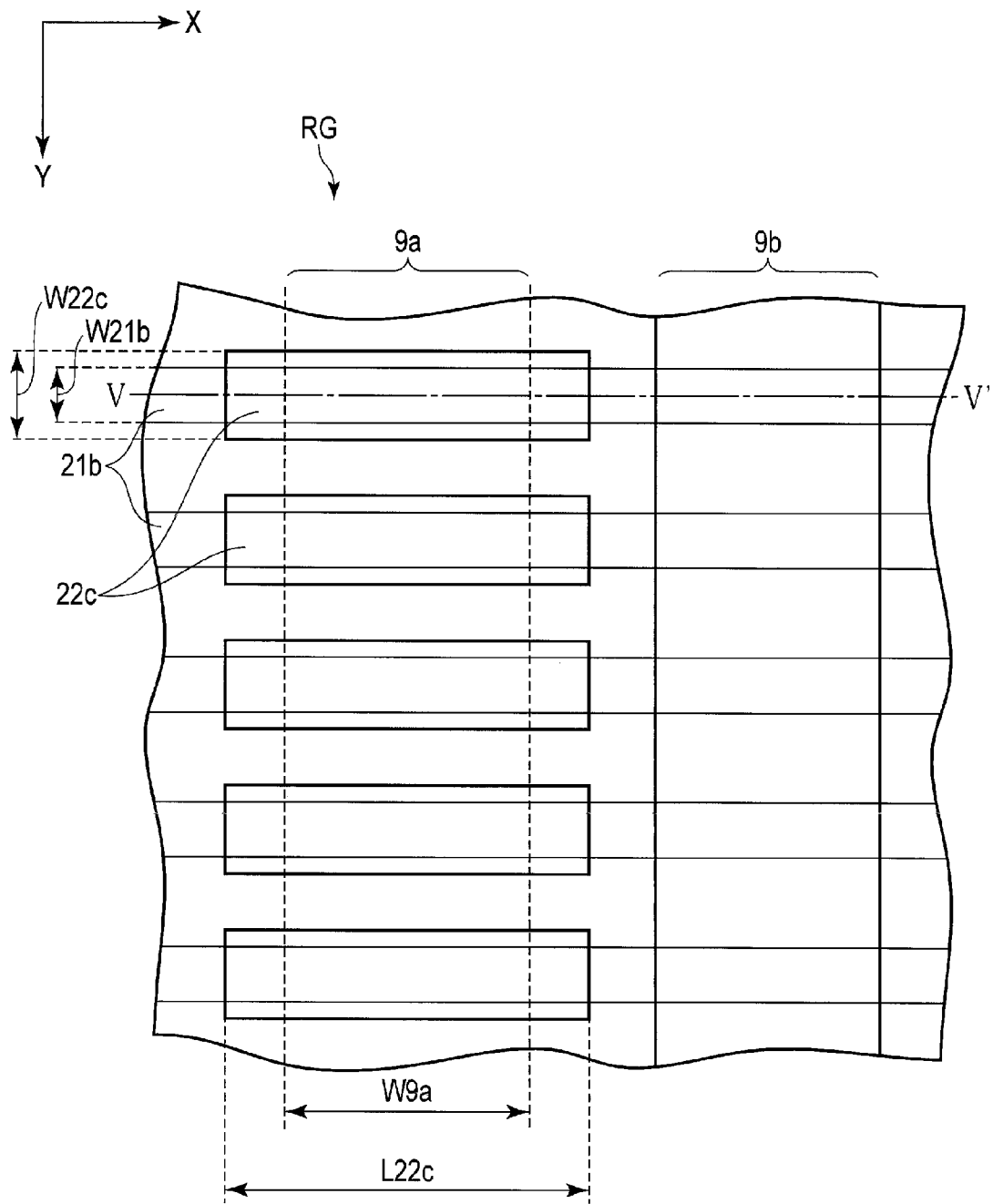
FIG. 4 is a partially enlarged view of the display area shown in FIG. 3.

FIG. 4 is an expanded view showing a region RG enclosed by a solid line in the peripheral area 9 shown in FIG. 3.

The wiring lines 21b drawn out along the row direction X are covered by belt-like metallic protective films 22c, respectively in regions approximately corresponding to the trench 9a. That is, the metallic protective films 22c have a width W22c slightly greater than a width W21b of the wiring lines 21b and a length L22c greater than the width W9a of the trench 9a and are formed above the respective wiring lines 21b in the regions approximately corresponding to the trench 9a. Specifically, as will be described later, the trench 9a is formed to expose the wiring lines 21b and the belt-like metallic protective films 22c are formed on the portions of the wiring lines 21b exposed in the trench 9a, both side surfaces of the trench 9a and both upper surfaces of the trench 9a.

FIG. 5A is a cross section taken along the line V-V' in FIG. 3. FIG. 5A shows only the main portions of the pixel area 8, the peripheral area 9 and the terminal area 10a, and part of the light-emitting device EL and the counter-substrate 200 are omitted. The pixel area 8, the peripheral area 9 and the terminal area 10a are formed over the insulating substrate 100. The insulating substrate 100 is formed of, for example, an insulating material such as glass or resin. In addition to the configuration of this embodiment, one or more insulating films may be formed on the insulating substrate 100.

In the pixel area 8, the peripheral area 9 and the terminal area 10a, a first insulating film 101, a first protective film PF1, a second insulating film 102, a second protective film PF2 and a third insulating film 103 are formed in this order above the insulating substrate 100.

In the pixel area 8, the light-emitting device EL and a thin film transistor as a switching element which drives the light emitting device EL are formed. FIG. 5A illustrates the drive transistor Tr2 in FIG. 2. In this embodiment, the drive transistor Tr2 is a top-gate thin-film transistor. In the following descriptions, the term "transistor" in some cases refers to a device at least comprising a semiconductor layer including a source region, a drain region and a channel region provided between the source region and the drain region, a gate insulating film formed at least on the channel region of the semiconductor layer and a gate electrode.

In the pixel area 8, an island-like semiconductor layer 20, which constitutes the drive transistor Tr2, is formed above the insulating substrate 100. The semiconductor layer 20 is formed from, for example, a transparent amorphous semiconductor (transparent amorphous oxide Semiconductor: TAOS) such as indium-gallium-zinc oxide (IGZO).

The semiconductor layer 20 comprises a drain region 20a, a source region 20b and a channel region 20c provided between the drain region 20a and the source region 20b. A gate electrode 21a2 is formed directly above the channel regions 20c via a first insulating film (gate insulating film) 101 of silicon oxide, for example.

The insulating substrate 100, the semiconductor layer 20, the first insulating film 101 and the gate electrode 21a2 are covered by a first protective film PF1. More specifically, the first protective film PF1 is in contact with an upper surface 20aT of the drain region 20a, an upper surface 20bT of the source region 20b, a side surface 101S of the first insulating film 101 and an upper surface 21aT of the gate electrode 21a2. The first protective film PF1 is formed from, for example, a metal oxide film such as an aluminum oxide ($Al_2O_3$). The first protective film PF1 may be formed of a material other than aluminum oxide, that is, for example, titanium oxide, erbium oxide or the like. The first protective film PF1 has a thickness TPF1 of, for example, 3 to 30 nm.

On the first protective film PF1, a second insulating film (a first interlayer insulating film) 102 formed from, for example, an organic insulating material such as polyimide or acryl is formed. Note that organic materials have a moisture diffusion coefficient higher than that of inorganic materials, and therefore the organic material itself can give rise to a path (course) through which moisture from the external environment and residual moisture inside the display device enter the pixel area 8. Therefore, if an organic material is used for the structure members of the organic EL display device, for example, the protective film and the interlayer insulating film, it is very important to block the moisture diffusion path of the organic material in realization of a high reliability of an organic EL display device.

On the second insulating film 102, drain/source electrodes 22a2 and 22b2 are formed. In the second insulating film 102 and the first protective film PF1, contact holes CH1 and CH2, which partially expose the drain/source regions 20a and 20b of the semiconductor layer 20 are formed, and the drain/source electrodes 22a2 and 22b2 are connected to the drain/source regions 20a and 20b of the semiconductor layer 20, respectively, through the contact holes CH1 and CH2. In the example illustrated, the drain/source electrodes 22a2 and 22b2 are in contact also with the first protective film PF1.

On the second insulating film 102, a second protective film PF2 is formed to cover the drain/source electrodes 22a2 and 22b2. The second protective film PF2 is in contact with an upper surface 22aT of the drain electrode 22a2 and an upper surface 22bT of the source electrode 22b2. The second protective film PF2 is formed from, for example, a metal oxide film such as of aluminum oxide ($Al_2O_3$). The second protective film PF2 may be formed a material other than an aluminum oxide, that is, for example, titanium oxide, erbium oxide or the like. The second protective film PF2 has a thickness TPF2 greater than the thickness TPF1, that is, for example, 30 to 100 nm.

On the second protective film PF2, a third insulating film (a second interlayer insulating film) 103 formed from, for example, an organic insulating materials such as polyimide or acryl is formed. On the third insulating film 103, a pixel electrode 23a, which constitutes the light emitting device EL, is formed. The pixel electrode 23a functions as, for example, an anode of the light emitting device EL. In the third insulating film 103 and the second protective film PF2, a contact hole CH3 which partially exposes, for example, the source electrodes 22b2 is provided, and the pixel electrode 23a is connected to the source electrode 22b2 of the drive transistor Tr2 through the contact hole CH3. Further, the pixel electrode 23a is connected to a second electrode of the capacitor Cs (not shown).

On the pixel electrode 23a and the third insulating film 103, a fourth insulating film 104 as a pixel regulating layer including, for example, a slope, is formed. On the pixel electrode 23a and the fourth insulating film 104, a light-emitting layer 24 of, for example, an organic material is formed. On the light-emitting layer 24, a common electrode (cathode) 25 is formed. The light-emitting layer 24 emits light according to the voltage applied between the pixel electrode 23a and the common electrode 25.

The peripheral area 9 is located adjacent to the pixel area 8. In the peripheral area 9, the trenches 9a and 9b are formed to prevent the invasion of moisture and the like to the pixel area 8 from the outside.

In the peripheral area 9, the first insulating film 101 is formed above the insulating substrate 100. The wiring line 21b is formed on the first insulating film 101. The wiring line 21b is formed of the same metal material as that of the gate electrode 21a2 and is extended from the pixel area 8 to the terminal area 10a. FIG. 5A shows the case where the wiring line 21b is the first scanning line WL in FIGS. 1 and 2. In this case, the wiring line 21b is connected to the gate electrode of the write transistor Tr1 (not shown). Note that when the wiring line 21b is the second scanning line RL in FIGS. 1 and 2, the wiring line 21b is connected to the gate electrode of the reset transistor Tr3 (not shown).

The wiring line 21b is covered by the first protective film PF1. That is, the first protective film PF1 is provided on the wiring line 21b to be in contact with the wiring line 21b. On the first protective film PF1, the second insulating film 102 of an organic insulating material is formed. In the second insulating film 102 and the first protective film PF1, the trench 9a which partially exposes the wiring line 21b is formed. Thus, the second insulating film 102 is divided into a second insulating film 102a formed on a pixel area 8 side and a second insulating film 102b formed on a terminal area 10a side.

The wiring line 21b exposed from the bottom of the trench 9a is covered by the metallic protective film 22c formed in the trench 9a. In the trench 9a, the metallic protective film 22c is in contact with the wiring line 21b, the first protective film PF1 and the second insulating film 102. In the example illustrated, the metallic protective film 22c is formed on the wiring line 21b on the bottom of the trench 9a, on the side surface PF1S of the first protective film PF1 and the side surface 102S of the second insulating film 102 which constitute the side surfaces of the trench 9a, and on a part of the second insulating film 102. The metallic protective film 22c is formed of the same metal material as that of the drain/source electrodes 22a2 and 22b2.

Note that the metallic protective film 22c can be omitted occasionally. In this embodiment, the same aluminum-based material is used for the wiring line 21b and the metallic protective film 22c. Therefore, when etching the metallic protective film 22c, the underlying wiring line 21b may be greatly damaged. This example illustrates the case where the wiring line 21b is covered by the metallic protective film 22c in order to reduce the damage of the wiring line 21b. But depending on a combination of a material which can reduce the damage of the underlying wiring line 21b while etching the metallic protective film 22c, the etching method and the etchant, it may not be necessary to form the metallic protective film 22c.

On the metallic protective film 22c and the second insulating film 102, the second protective film PF2 is formed to be in contact therewith. On the second protective film PF2, the third insulating film 103 is formed to be in contact therewith. The third insulating film 103 is formed of an organic insulating material. In the third insulating film 103 and the second protective film PF2, the trench 9b which partially exposes the second insulating film 102 is formed. Thus, the third insulating film 103 is divided into a third insulating film 103a on a pixel area 8 side, and a third insulating film 103b on a terminal area 10a side.

The trench 9b is provided in a region which does not overlap the trench 9a. In the example illustrated, the trench 9b is separated further from the pixel area 8 than the trench 9a. That is, the trench 9b is formed between the trench 9a and the terminal area 10a.

The reason why the above-described structure can prevent the entering of moisture will now be described. Arrows of dotted lines in FIG. 5A indicate an example of the path of moisture when the moisture diffuses from the exterior of the display device 1 to the pixel area 8. The path of the moisture diffusing from the terminal area 10a through the third insulating film 103 to the pixel area 8 is blocked by the trench 9b. The path of the moisture diffusing from the trench 9b to the pixel area 8 side through the second insulating film 102 is blocked by the trench 9a. Further, since the second protective film PF2 of, for example, aluminum oxide is formed between the second insulating film 102 and the third insulating film 103, the path of the moisture diffusing from the second insulating film 102 to the third insulating film 103 is blocked by the second protective film PF2. As described, even if the trench 9a and the trench 9b are separated from each other, it is possible to prevent the diffusion of moisture from the terminal area 10a side to the pixel area 8 through the second insulating film 102 and the third insulating film 103.

The terminal 23b is formed in the terminal area 10a.

In the terminal area 10a, the configuration from the insulating substrate 100 to the first protective film PF1 is similar to that of the peripheral area 9. The second insulating film 102 is formed on the first protective film PF1. In second insulating film 102 and the first protective film PF1, an opening 102c which partially exposes the wiring line 21b is formed to correspond to a respective wiring line 21b.

The metallic protective film 22d which protects the wiring line 21b is formed in the opening 102c and on a periphery of the opening 102c of the second insulating film 102. In the example illustrated, the metallic protective film 22d is in contact with the wiring line 21b in the opening 102c, and also with the first protective film PF1 and the second insulating film 102. The metallic protective film 22d, in addition to reducing the damage to the wiring line 21b, which may be caused in each manufacturing step of the display device 1, also functions a relay electrode between the terminal 23b and the wiring line 21b. Here, as described above, the same aluminum-based material is used for the wiring line 21b and the metallic protective film 22d in this embodiment. Therefore, while etching the metallic protective film 22d, the underlying wiring line 21b may be greatly damaged. Therefore, the example illustrates the case where the wiring line 21b is covered by the metallic protective film 22d. But depending on a combination of a material which can reduce the damage of the underlying wiring line 21b while etching the metallic protective film 22d, the etching method and the etchant, it may not be necessary to form the metallic protective film 22d. (This is also the case in the description of the manufacturing method which will be later described.)

The second protective film PF2 is formed on the second insulating film 102 and on a periphery of the opening 102c of the metallic protective film 22d.

The third insulating film 103 is formed on the second protective film PF2. In the third insulating film 103 and the second protective film PF2, an opening 103c which exposes the metallic protective film 22d is formed in a region corresponding to the opening 102c. On a periphery of the opening 103c of the third insulating film 103 and in the opening 103c, the terminal 23b is formed to be in contact with the metallic protective film 22d. More specifically, in the opening 103c, the terminal 23b is in contact with an upper surface 22dT of the metallic protective film 22d, a side surface PF2S of the second protective film PF2 and a side surface 103S of the third insulating film 103. Further, the terminal 23b is in contact with the metallic protective film 22d in the opening 102c.

FIG. 5B is a cross section taken along the line A-B shown in FIG. 3. FIG. 5B shows only the part discussed in the following description, thus omitting the light-emitting device EL or the like. In the region shown in FIG. 5B, the wiring line 22b and the terminal 23b are not formed. Accordingly, the first insulating film 101, the metallic protective film 22c or the metallic protective film 22d is not formed, either.

In the peripheral area 9, the first protective film PF1 is located above the insulating substrate 100. In the example illustrated, the first protective film PF1 is in contact with the insulating substrate 100. The trench 9a partially exposes the insulating substrate 100. The second protective film PF2 is formed on the second insulating film 102 and in the trench 9a as well. In the trench 9a, the second protective film PF2 is in contact with at least the first protective film PF1. In the example illustrated, the second protective film PF2 is in contact with the top of the insulating substrate 100, the side surfaces PF1S and the side surfaces 102S.

In the terminal area 10b, the first protective film PF1 is located above the insulating substrate 100. In the example illustrated, the first protective film PF1 is in contact with the insulating substrate 100. The second insulating film 102 is formed on the first protective film PF1 to be in contact with the first protective film PF1. The second protective film PF2 is formed on the second insulating film 102 to be in contact with the second insulating film 102.

Next, a method of manufacturing the display device 1 according to this embodiment will be described with reference to FIGS. 6 to 9.

Figure 6A:
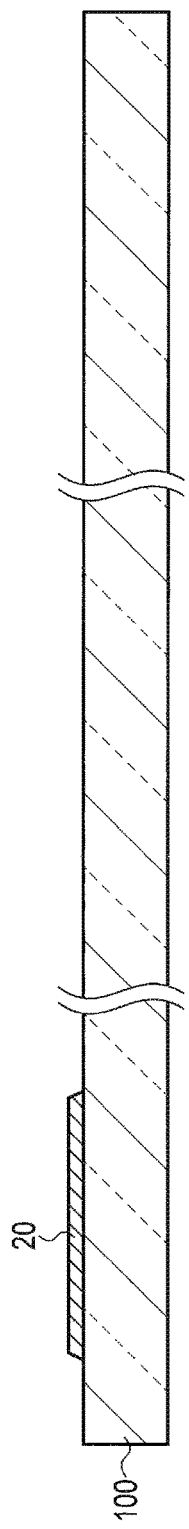
FIG. 6A is a cross section showing an example of the method of manufacturing the display device shown in FIG. 5.

As shown in FIG. 6A, in the pixel area 8, the island-like semiconductor layer 20 is formed on the insulating substrate 100 formed of an insulating material such as glass or resin. The semiconductor layer 20 is formed into a desired pattern by, for example, the following technique. That is, a semiconductor layer is formed on an entire surface of the insulating substrate 100 using the sputtering method. Then, the resultant is subjected to photolithography, and then etched.

The semiconductor layer 20 contains at least one of oxides of, for example, indium (In), gallium (Ga) and tin (Sn). Examples of the material for forming the semiconductor layer 20 are indium-gallium-zinc oxide (IGZO), indium-gallium oxide (IGO), indium-zinc oxide (IZO), zinc-tin oxide (ZnSnO) and zinc oxide (ZnO). The thickness of the semiconductor layer 20 is, for example, 10 to 50 nm.

Figure 6B:
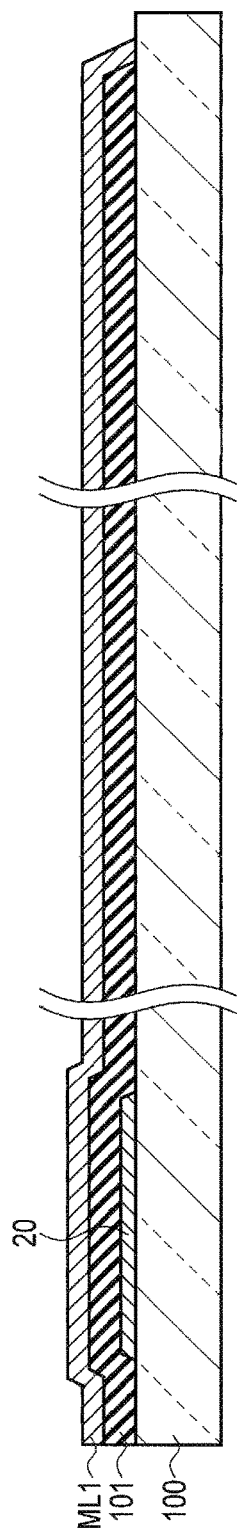
FIG. 6B is a cross section showing a manufacturing step which follows that shown in FIG. 6A.

Subsequently, as shown in FIG. 6B, the first insulating film 101 is formed on the entire surface of the insulating substrate 100 so as to cover the semiconductor layer 20. The first insulating film 101 is formed of, for example, silicon oxide ($SiO_2$) using, for example, a chemical vapor deposition (CVD). The thickness of the first insulating film 101 is, for example, 100 to 500 nm.

Next, on the first insulating film 101, a first metal layer ML1 is formed using, for example, the sputtering method. The first metal layer ML1 has, for example, a layered structure of titanium, aluminum and molybdenum nitride. Note that the first metal layer ML1 may be formed of, for example, an alloy of aluminum (Al), copper (Cu), or an alloy of copper or the like. The thickness of first metal layer ML1 is, for example, 200 to 600 nm.

Figure 6C:
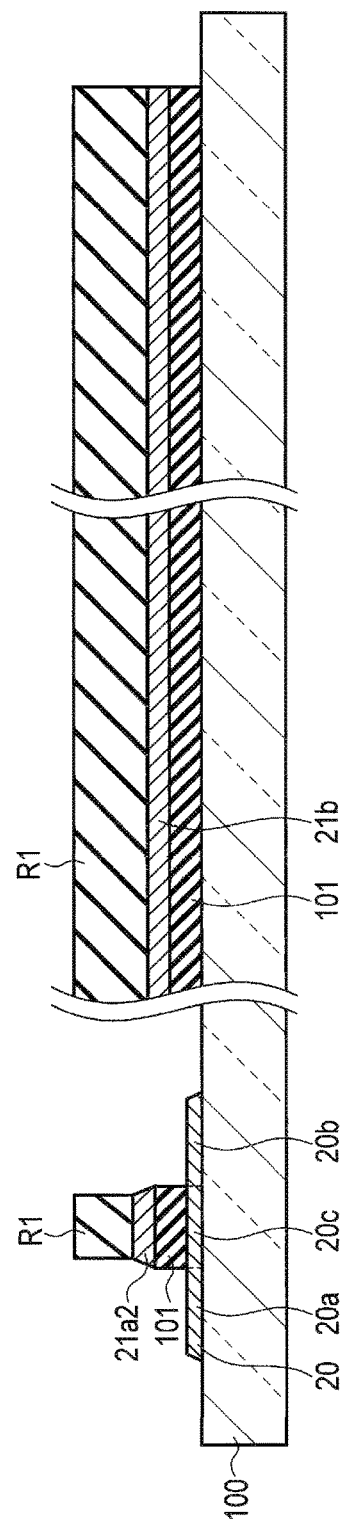
FIG. 6C is a cross section showing a manufacturing step which follows that shown in FIG. 6B.

Next, as shown in FIG. 6C, a resist layer R1 patterned by photolithography is formed on the first metal layer ML1. The resist layer R1 is formed in a region corresponding to the gate electrode of the drive transistor Tr2 in the pixel area 8, and in regions corresponding to the respective wiring lines in the peripheral area 9 and the terminal area 10a.

Next, using the resist layer R1 as a mask, the first metal layer ML1 is etched. When the first metal layer ML1 is formed of, for example, titanium, the first metal layer ML1 is subjected to dry etching using, for example, a $CF_4/O_2$-based gas. When the first metal layer ML1 is formed of, for example, aluminum or molybdenum nitride, the first metal layer ML1 is subjected to wet etching using an acidic etchant. Thus, the gate electrode 21a2 is formed in the pixel area 8, and the wiring line 21b is formed in the peripheral area 9 and the terminal area 10a.

Next, the first insulating film 101 is subjected to dry etching using $CF_4/O_2$-based and $SF_6/O_2$-based gases. Here, the regions of the semiconductor layers 20, which are not covered by the gate electrode 21a2 and the first insulating film 101, are over-etched in the pixel area 8. In the over-etched regions, oxygen-vacancy defects are generated, and thus the drain region 20a and the source region 20b which have low resistance are formed. Moreover, the channel region 20c is formed between the drain region 20a and the source region 20b.

Next, as shown in FIG. 7A, the first protective film PF1 of, for example, aluminum oxide ($Al_2O_3$) is formed all over the insulating substrate 100. That is, the first protective film PF1 is formed so as to cover the semiconductor layer 20, the first insulating film 101, the gate electrode 21a2 and the wiring line 21b. The first protective film PF1 is formed by, first, forming, for example, a 5-nm aluminum film using the sputtering method, and then oxidizing the aluminum film with heat treatment.

When oxidizing the aluminum film by the heat treatment, part of oxygen contained in the semiconductor layer 20 is utilized for oxidation reaction of the aluminum film. That is, in the region of the semiconductor layers 20, which is in contact with the aluminum film, oxygen diffuses to the aluminum film and the oxygen-vacancy defect is generated to function as a donor. Therefore, the drain/source regions 20a and 20b in contact with the aluminum film are made to have lower resistance by the heat treatment. In the channel region 20c which is not in contact with the aluminum film, the resistance is maintained to be higher than that of the drain/source regions 20a and 20b.

Note that the first protective film PF1 may be formed by forming an aluminum oxide film using a sputtering method.

Next, as shown in FIG. 7B, the second insulating film 102 (first interlayer insulating film), which has photosensitivity, is formed the entire surface of the first protective film PF1. The second insulating film 102 is formed of, for example, an organic insulating material such as polyimide or acryl, and a plurality of openings and trench portions are formed in the second insulating film 102 by photolithography.

That is, in the pixel area 8, openings which partially expose the first protective film PF1 above the drain/source regions 20a and 20b, respectively, are formed. In the peripheral area 9, a trench which partially exposes the first protective film PF1 and surrounds the pixel area 8 is formed. Thus, the second insulating film 102 is spatially divided into the second insulating film 102a on the pixel area 8 side and the second insulating film 102b on the terminal area 10a side. In the terminal area 10a, an opening partially exposes the first protective film PF1 is formed above the end of each wiring line 21b.

Next, the first protective film PF1 is etched by, for example, a dry etching method using the second insulating film 102 as a mask. Thus, in the pixel area 8, the contact holes CH1 and CH2 which partially expose the drain/source regions 20a and 20b are formed. In the peripheral area 9, the trench 9a which partially exposes the wiring line 21b and surrounds the pixel area 8 is formed. In the terminal area 10a, the opening 102c which partially exposes the wiring line 21b is formed to correspond to the respective wiring line 21b.

The figure enclosed by a circle of solid line is an enlarged view of a part of the trench 9a. Since the first protective film PF1 is etched using the second insulating film 102 as a mask, the side surface PF1S of the first protective film PF1 and the side surface 102S of the second insulating film 102 are flush with each other in the trench 9a. In other words, the side surface PF1S is not covered by the second insulating film 102. In the example illustrated, the side surface PF1S and the side surface 102S are continuous in straight, but they may be curvedly continuous. The contact holes CH1 and CH2, and the opening 102c formed by the same process as that of the trench 9a have a structure similar to that just described.

Figure 7C:
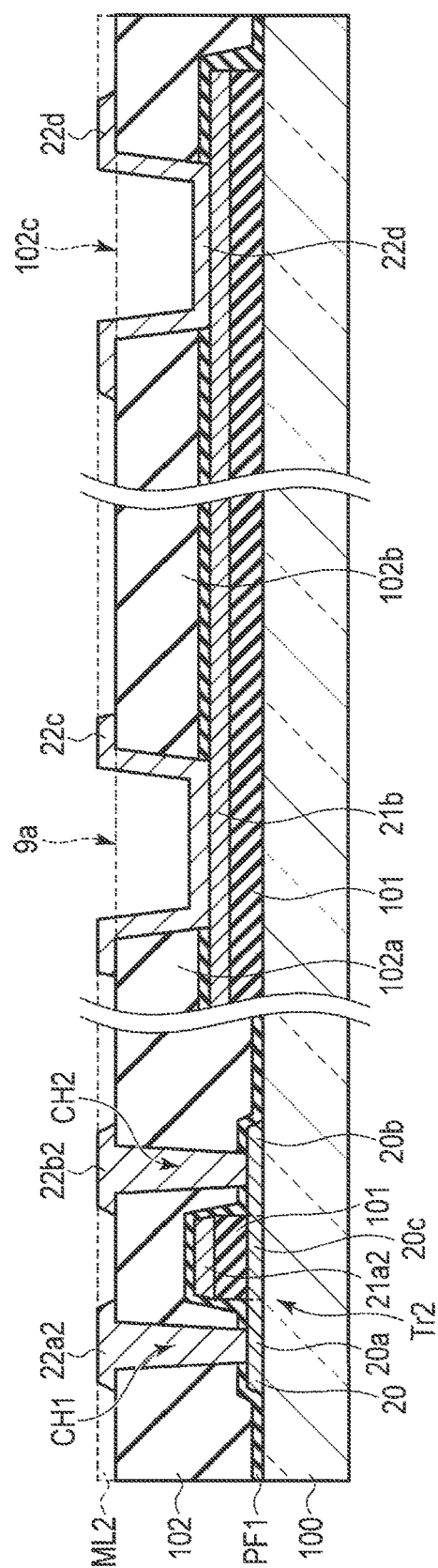
FIG. 7C is a cross section showing a manufacturing step which follows that shown in FIG. 7B.

Next, as shown in FIG. 7C, a second metal layer ML2 is formed on the second insulating film 102 using, for example, the sputtering method. The second metal layer ML2 is formed also in the trench 9a and the opening 102c. The second metal layer ML2 is formed to have, for example, a three-layer structure of molybdenum, aluminum and molybdenum nitride. The thickness of the second metal layer ML2 is, for example, 200 to 600 nm. The contact holes CH1 and CH2 are buried with the second metal layer ML2.

Next, the second metal layer ML2 is subjected to photolithography, and after that, it is wet-etched using an acidic etchant. Thus, in the pixel area 8, the drain/source electrodes 22a2 and 22b2 are formed through the second insulating film 102 to be connected to the drain/source regions 20a and 20b. In the peripheral area 9, the belt-like metallic protective film 22c is formed in the trench 9a to cover the respective wiring line 21b. In the terminal area 10a, the metallic protective film 22d is formed in the opening 102c to cover the respective wiring line 21b.

Next, as shown in FIG. 8A, the second protective film PF2 of, for example, aluminum oxide is formed on the entire surface of the second insulating film 102 using, for example, the sputtering method. The second protective film PF2 is formed to cover the drain/source electrodes 22a2 and 22b2 and also in the trench 9a and the opening 102c. The second protective film PF2 is formed so as to be thicker than the first protective film PF1. The thickness TPF2 of the second protective film PF2 is, for example, 30 to 60 nm.

Next, as shown in FIG. 8B, the third insulating film 103 (the second interlayer insulating film) which has photosensitivity is formed on the second protective film PF2. The third insulating film 103 is formed of, for example, an organic insulating material such as polyimide and acryl, and a plurality of openings and trenches are provided in the third insulating film 103 by photolithography.

That is, in the pixel area 8, an opening which partially exposes the second protective film PF2 above the drain electrode 22a2 is formed in the third insulating film 103. In the peripheral area 9, a trench which partially exposes the second protective film PF2 is formed in a region which does not overlap the trench 9a provided in the second insulating film 102 and the first protective film PF1, that is, so as to surround the trench 9a, more distant from the pixel area 8 with respect to the trench 9a. Thus, the third insulating film 103 is spatially divided into a third insulating film 103a on a pixel area 8 side and a third insulating film 103b on a terminal area 10a side. In the terminal area 10a, an opening partly exposes the second protective film PF2 is formed in a region which overlaps the opening 102c provided in the second insulating film 102 and the first protective film PF1.

Next, the second protective film PF2 is subjected to wet etching with, for example, an etchant containing fluoric acid using the third insulating film 103 as a mask. Thus, in the pixel area 8, the contact hole CH3 which partially exposes the source electrode 22b2 is formed. In the peripheral area 9, the second insulating film 102 is exposed to form the trench 9b which surrounds the trench 9a. In the terminal area 10a, the opening 103c which exposes the metallic protective film 22d is formed. The figure enclosed by a circle of solid line is an enlarged view of a part of the opening 103c. Since the second protective film PF2 is etched using the third insulating film 103 as a mask, the side surface PF2S of the second protective film PF2 and the side surface 103S of the third insulating film 103 are flush with each other in the opening 103c. In other words, the side surface PF2S is not covered by the third insulating film 103. On the other hand, the opening 103c partially exposes the upper surfaces 22dT of the metallic protective film 22d.

Figure 9:
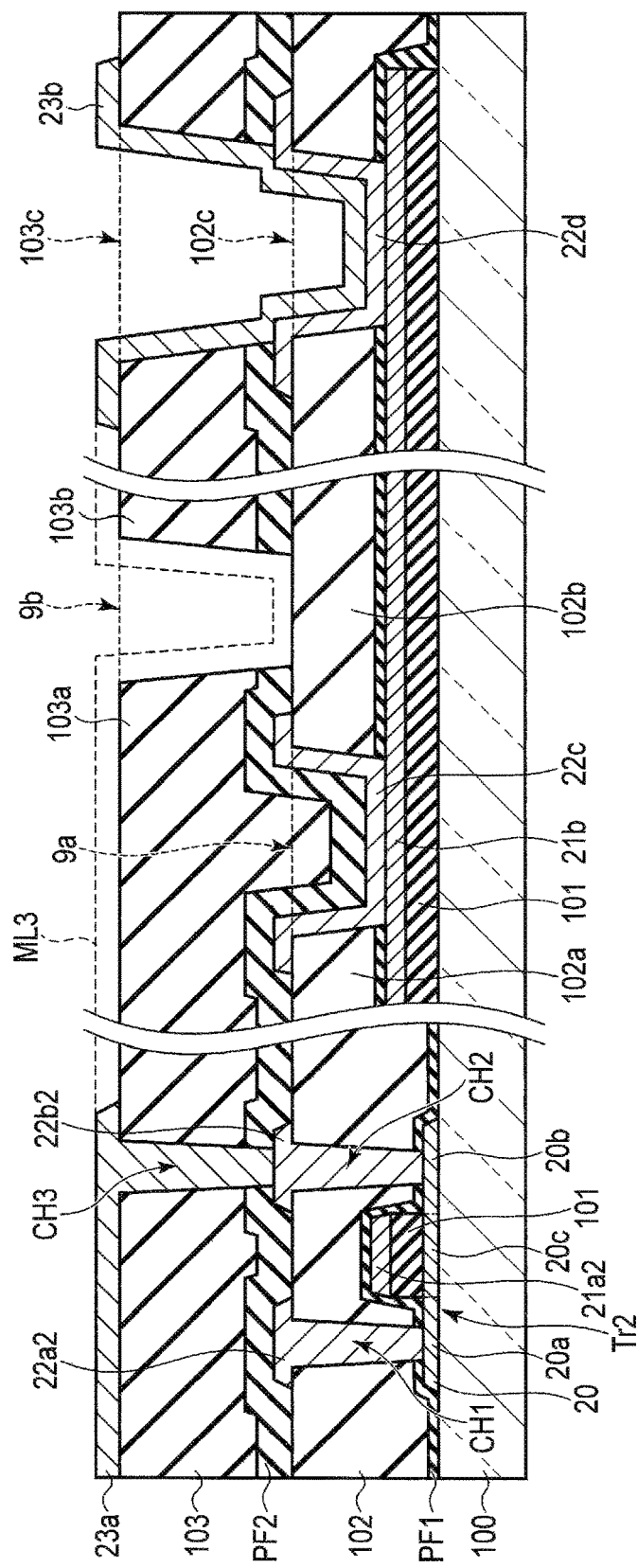
FIG. 9 is a cross section showing a manufacturing step which follows that shown in FIG. 8B.

Next, as shown FIG. 9, a third metal layer ML3 of, for example, an alloy of aluminum (Al) and neodymium (Nd) is formed on the third insulating film 103 using, for example, the sputtering method. In the pixel area 8, the contact hole CH3 is buried with the third metal layer ML3, and the opening 103c is buried with the third metal layer ML3 in the terminal area 10a.

Next, the third metal layer ML3 is subjected to photolithography, and after that, it is wet-etched using an acidic etchant. Thus, in the pixel area 8, the pixel electrode 23a is formed to be connected to the source electrode 22b2 of the drive transistor Tr2 and the terminal 23b is formed in the terminal area 10a.

Then, in the pixel area 8, a fourth insulating film (pixel regulation layer) 104 is patterned. The fourth insulating film 104 is formed of, for example, an organic insulating material such as polyimide or acryl. Subsequently, on the pixel electrode 23a and the fourth insulating film 104, the light-emitting layer 24 of an organic material and the common electrode 25 are stacked in this order, thus forming the light emitting device EL. Thus, the display device 1 shown in FIG. 5 is formed.

FIG. 10 is a cross section taken along the line X-X in FIG. 3. FIG. 10 shows the write transistor Tr1 shown in FIG. 2 in the pixel area 8.

In the pixel area 8, the write transistor Tr1 is covered by the first protective film PF1 and the second protective film PF2 as in the case of the drive transistor Tr2. For example, the source electrode 22b1 of the write transistor Tr1 is drawn out to the terminal area 10b through the peripheral area 9 as the wiring line 22e. The wiring line 22e is equivalent to the data line DL shown in FIGS. 1 and 2.

In the peripheral area 9, the first protective film PF1 is located above the insulating substrate 100. In the example illustrated, the first protective film PF1 is in contact with the insulating substrate 100. On the first protective film PF1, the second insulating film 102 of an organic insulating material is formed. In the second insulating film 102 and the first protective film PF1, the trench 9a which partially exposes the insulating substrate 100 is formed. Thus, the second insulating film 102 is divided into the second insulating film 102a formed on the pixel area 8 side and the second insulating film 102b formed on the terminal area 10b side.

The wiring line 22e is formed on the second insulating film 102 and in the trench 9a. The wiring line 22e is in contact with at least the first protective film PF1. In the example illustrated, the wiring line 22e is in contact with the insulating substrate 100 in the trench 9a, and also with the side surface PF1Sa of the first protective film PF1 and the side surface 102Sa of the second insulating film 102. The wiring line 22e is formed of the same metal material as that of the drain/source electrodes 22a1 and 22b1 of the write transistor Tr1.

The second protective film PF2 is formed on the wiring line 22e. On the second protective film PF2, the third insulating film 103 is formed. In the third insulating film 103 and the second protective film PF2, the trench 9b which partially exposes the wiring line 22e is formed. Thus, the third insulating film 103 is divided into the third insulating film 103a formed on the pixel area 8 side and the third insulating film 103b formed on the terminal area 10b side.

In the trench 9b, the metallic protective film 23d which protects the respective wiring line 22e is formed. That is, the metallic protective film 23d is formed above the respective wiring line 22e in a region substantially corresponding to the trench 9b. The metallic protective film 23d is in contact with the wiring line 22e, the second protective film PF2 and the third insulating film 103 in the trench 9b. More specifically, the metallic protective film 23d is formed on the wiring line 22e on the bottom of the trench 9b, the side surface PF2Sb of the second protective film PF2 and the side surface 103Sb of the third insulating film 103 which constitute the side surface of the trench 9b and a part of the surface of the third insulating film 103. The metallic protective film 23d functions as a protective film for reducing the damage to the wiring line 22e in each processing step in the manufacturing of the display device 1. The metallic protective film 23d is formed of the same metal material as that of the pixel electrode 23a described above.

Note that a protective film of the same insulating material as to that of the fourth insulating film 104 shown in, for example, FIG. 5, may be formed only on the metallic protective film 23d as needed. Thus, it is possible to prevent short-circuiting between the wiring line 22e and some other metal material, for example, the common electrode 25.

The terminal 23c is formed in the terminal area 10b.

More specifically in the terminal area 10b, the first protective film PF1 is formed above the insulating substrate 100. On the first protective film PF1, the second insulating film 102 is formed. On the second insulating film 102, the wiring line 22e is formed. The second protective film PF2 is formed on the wiring line 22e. On the second protective film PF2, the third insulating film 103 is formed. In the third insulating film 103 and the second protective film PF2, an opening 103d which partially exposes the wiring line 22e is formed. In the opening 103d, the terminal 23c in contact with the wiring line 22e is formed. In the example illustrated, the terminal 23c is in contact with the wiring line 22e in the opening 103d, and also with the side surface PF2Sd of the second protective film PF2 and the side surface 103Sd of the third insulating film 103.

In the region which overlaps the line C-D shown in FIG. 3, the wiring line 22e and the terminal 23c are not formed. Accordingly, the metallic protective film 23d is not formed. The cross section taken along the line C-D is similar to that of FIG. 5B except the thin film transistor is the write transistor Tr1.

Note that FIGS. 5A to 10 illustrate the drive transistor Tr2 and the write transistor Tr1 as an example, but the reset transistor Tr3 as well is covered by the first protective film PF1 and the second protective film PF2 as in the case of the write transistor Tr1 and the drive transistor Tr2.

According to this embodiment, the thin film transistor formed in the pixel area 8 is covered by the two protective films formed of, for example, aluminum oxide. That is, the first protective film PF1 covers, for example, the semiconductor layer 20, the gate insulating film 101 and the gate electrodes 21a1 and 21a2 of the write transistor Tr1 and drive transistor Tr2 and the second protective film PF2 covers the drain/source electrodes 22a1, 22b1, 22a2, and 22b1 provided on the second insulating film 102. Therefore, as compared to the case where there is only one protective film, it is possible to suppress contact between the semiconductor layer 20 of the thin film transistor formed in the pixel area 8 and moisture and hydrogen. For example, even if a defect such as a crack is created in the first protective film PF1, the second protective film PF2 can inhibit the entering of moisture and hydrogen into the semiconductor layer 20 from the third insulating film 103. As a result, it is possible to inhibit degradation of the semiconductor layer 20 by moisture and reduction by hydrogen. Therefore, the carrier density of the semiconductor layer 20 is stabilized, and the electrical characteristics of the thin film transistor provided in the pixel area 8 can be stabilized.

Moreover, with the second protective film PF2 provided on the second insulating film 102 as an interlayer insulating film, the second protective film PF2 can be formed to have sufficient thickness to prevent invasion of moisture and hydrogen. In other words, with the second protective film PF2 provided on the second insulating film 102, even if the second protective film PF2 is thickened to such an extent to have sufficient protective performance, the processability of the second protective film PF2 can be maintained.

More specifically, the second insulating film 102 underlying the second protective film PF2 has resistance against acidic etchants. Further, when the surface of the metal layer underlying the second protective film PF2 is formed of, for example, a metal material having high etching selectivity with respect to aluminum oxide, that is, such as titanium and molybdenum, an acidic etchant can be used for etching the second protective film PF2. Therefore, even if the second protective film PF2 is formed sufficiently thick, the wet etching method, which has relatively high etching rate, can be employed, thereby making it possible to suppress the increase in manufacturing time.

Moreover, the second protective film PF2 is etched using the third insulating film 103 with the contact hole CH3 and the like formed therein, as a mask, and the first protective film PF1 is etched using, as a mask, the second insulating film 102 in which, for example, the contact holes CH1 and CH2 and the like are formed. That is, in order to remove the first protective film PF1 and the second protective film PF2, no further photolithography process is required. Therefore, it is possible to manufacture a highly protective display device without increasing the manufacturing steps.

Moreover, with the second protective film PF2 provided on the second insulating film 102 as an interlayer insulating film, the size of the thin film transistor can be reduced. For example, when the second protective film PF2 is provided under the second insulating film 102, that is, on the first protective film PF1 via, for example, an organic insulating film, photolithography and etching need to be carried out a plurality of times to form the openings, for example, the contact holes CH1 and CH2. In this case, from the second photolithography (exposure) on, the alignment accuracy to the pattern formed by the first photolithography and the etching process must be considered. In reality, it is inevitable to design the diameter of the contact holes basically larger than that of the first photolithography from the second time on. As a result, the diameter of the openings of the contact holes CH1 and CH2, etc. is made larger than that made by photolithography and etching process carried out one time. Under the circumstances, it is difficult to finely downsize the display device. On the other hand, according to this embodiment, only one set of the photolithography and etching process is carried out on each of the first protective film PF1 and the second protective film PF2, each of which consists of a monolayer. Therefore, it is possible to prevent the diameter of the openings of, for example, the contact holes CH1, CH2 and CH3 from becoming larger. Consequently, it is possible to finely downsize the display device.

Furthermore, the second protective film PF2 is formed to have a thickness required to protect the thin film transistor on the second insulating film 102, which is an interlayer insulating film. With this structure, the first protective film PF1 can be made thin. As a result, the time required to etch the first protective film PF1 can be shortened. Therefore, the damage which may be caused on the semiconductor layer 20 underlying the first protective film PF1 can be reduced. Moreover, even if the metallic wiring lines provided under the first protective film PF1, such as the wiring line 21b are formed of a metal material having a low etching selectivity with respect to the first protective film PF1, it is still possible to reduce the damage to the metal material by shortening the time required for the etching. Consequently, degradation of the electrical characteristics of the thin film transistor can be suppressed.

Moreover, it suffices if the second protective film PF2 formed on the second insulating film 102 covers only the stepped portions for one metal layer, that is, the stepped portions formed on the second insulating film 102 by the drain/source electrodes 22a2 and 22b2 and the metallic protective films 22c and 22d. Therefore, in this embodiment, as compared to the case where, for example, the second protective film PF2 is formed on the first protective film PF1, the coverage of the second protective film PF2 can be improved by forming the second protective film PF2 on the second insulating film 102.

Moreover, with the second protective film PF2 provided on the second insulating film 102, for example, the wiring line 21b is covered by the first protective film PF1 and the wiring line 22e is covered by the second protective film PF2. With this configuration, it is possible to inhibit degradation of the metallic wiring lines, which may be caused by contacting with moisture, etc.

In the peripheral area 9, the second protective film PF2 is provided on the second insulating film 102, and thus the trench 9a and the trench 9b, which inhibit invasion of moisture, can be formed in regions which do not overlap. That is, as shown in FIG. 5A, the second protective film PF2 is provided between the second insulating film 102 and the third insulating film 103, and therefore even if the trench 9a and the trench 9b are provided so as not to overlap each other, it is possible to block the path through which moisture may enter from the second insulating film 102 to the third insulating film 103.

For example, in the case where the trench 9a and the trench 9b are formed to overlap, photolithography and etching process are repeated in the region where the trenches are provided. Therefore, the metallic wiring layer underlying the trenches may be damaged. However, according to this embodiment, since the trench 9a and the trench 9b are formed so as not to overlap each other, it is possible to prevent the damage, which may be caused in each step of the manufacturing process, from being concentrated on one region.

Further, since the trench 9a and the trench 9b are formed so as not to overlap, the metallic protective film 22c provided in the trench 9a is not exposed by the trench 9b. That is, the wiring line 21b and the metallic protective film 22c which covers the wiring line 21b are covered by with the insulating material. With this configuration, it is possible to prevent the wiring line 21b from short-circuiting with some other metal material, for example, the common electrode 25.

Moreover, in the case where the trench 9a and the trench 9b are formed to overlap, for example, the depth of the trenches may become greater than the thickness of the resist layer applied on the third insulating film 103. In this case, a patterning error may occur during the photolithography. In contrast, according to this embodiment, the trench 9a and the trench 9b are formed so as not to overlap, it is possible to inhibit the depth of the trenches from becoming greatly larger than the thickness of the resist layer. Therefore, the patterning error can be inhibited.

As described above, by forming the trench 9a and the trench 9b in regions which do not overlap each other, the invasion of moisture to the pixel area 8 can be suppressed. Therefore, not only the degradation of the organic EL device can be suppressed, but also the yield in the manufacture of the display device can be enhanced, thereby making it possible to improve the productivity.

With the second protective film PF2 provided on the second insulating film 102 in the terminal area 10a, the metallic protective film 22d formed in the periphery of the opening 102c is covered by the second protective film PF2. A part of the side surface of the terminal 23b is in contact with the second protective film PF2. Further, in the terminal area 10b, a part of the side surface of the terminal 23c is in contact with the second protective film PF2. Thus, the contact area between the metal materials provided in the terminal area and the second insulating film 102 and the third insulating film 103, respectively, can be reduced as compared to the case where the second protective film PF2 is not formed, thereby making it possible to suppress the metal materials provided in the terminal area from contacting moisture. As a result, the degradation of the metal materials can be inhibited and the operation of the thin film transistor can be stabilized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a pixel area provided above an insulating substrate, and including pixels each including at least one thin film transistor comprising a semiconductor layer including a drain/source region separated by channel region and a gate electrode formed on the semiconductor layer prepared via a gate insulating film;
a first terminal area provided above the insulating substrate and including a first wiring line disposed thereon connected to the at least one thin film transistor;
a first protective film provided on the semiconductor layer, the gate electrode and the first wiring line, wherein the first protective film is configured as an insulating film containing a metal;
a first interlayer insulating film provided on the first protective film;
a second protective film provided on the first interlayer insulating film, as an insulating film containing a metal;
a second interlayer insulating film provided on the second protective film;
a first opening formed in the first protective film and the first interlayer insulating film in the first terminal area, and partially exposing the first wiring line; and
a second opening formed in the second protective film and the second interlayer insulating film to correspond to the first opening.

2. The display device of claim 1, further comprising:
a peripheral area provided at least between the pixel portion and the first terminal area,
wherein
in the peripheral area, the first protective film and the first interlayer insulating film comprises a first trench, and at least the second protective film is provided also in the first trench, and
in the peripheral area, the second protective film and the second interlayer insulating film comprise a second trench on an opposite side of the pixel portion with respect to the first trench.

3. The display device of claim 2, further comprising:
a first metallic film provided in at least one of the first trench and the first opening, and between the second protective film and at least the first interlayer insulating film, and in contact with the first wiring line.

4. The display device of claim 1, wherein
the second protective film is thicker than the first protective film.

5. The display device of claim 1, wherein
the first and second protective films are formed of aluminum oxide.

6. The display device of claim 1, wherein
the first and second interlayer insulating films are each formed of an organic material.

7. A display device comprising:
a pixel area provided above an insulating substrate, and including pixels each including at least one thin film transistor comprising a semiconductor layer including a drain/source region separated by channel region and a gate electrode formed on the semiconductor layer prepared via a gate insulating film;
a second terminal area provided above the insulating substrate;
a first protective film provided on the semiconductor layer, the gate electrode and the insulating substrate, as an insulating film containing a metal;
a first interlayer insulating film provided on the first protective film;
a second wiring line provided on the first interlayer insulating film and connected to the at least one thin film transistor;
a second protective film provided on the second wiring line, as an insulating film containing a metal;
a second interlayer insulating film provided on the second protective film; and
a third opening formed in the second protective film and the second interlayer insulating film in the second terminal area, and partially exposing the second wiring line.

8. The display device of claim 7, further comprising:
a peripheral area provided at least between the pixel area and the second terminal area,
wherein
in the peripheral area, the first protective film and the first interlayer insulating film comprises a third trench, and at least the second wiring line and the second protective film are provided also in the third trench, and in the peripheral area, the second protective film and the second interlayer insulating film comprise a fourth trench on an opposite side of the pixel portion with respect to the third trench.

9. The display device of claim 8, further comprising:

a second metallic film provided in at least one of the third opening and the fourth trench and in contact with the second wiring line.

10. The display device of claim 7, wherein
the second protective film is thicker than the first protective film.

11. The display device of claim 7, wherein
the first and second protective films are formed of aluminum oxide.

12. The display device of claim 7, wherein
the first and second interlayer insulating films are each formed of an organic material.

13. A display device comprising:

a pixel area including a thin film transistor and provided above an insulating substrate;

a peripheral area adjacent to the pixel area, provided above the insulating substrate;

a first protective film located above the insulating substrate;

a first interlayer insulating film located above the first protective film and in contact with the first protective film;

a second protective film located above the first interlayer insulating film and in contact with the first interlayer insulating film; and a second interlayer insulating film located above the second protective film and in contact with the second protective film, the first protective film and the first interlayer insulating film comprising a first trench, the second protective film being provided in the first trench, the second protective film is thicker than the first protective film, and the second protective film and the second interlayer insulating film comprising a second trench through to the first protective film and being separated from the pixel area further than the first trench.

* * * * *